United States Patent
Ma et al.

(10) Patent No.: US 7,557,395 B2
(45) Date of Patent: Jul. 7, 2009

(54) TRENCH MOSFET TECHNOLOGY FOR DC-DC CONVERTER APPLICATIONS

(75) Inventors: Ling Ma, Los Angeles, CA (US); Adam Amali, Hawthorne, CA (US); Siddharth Kiyawat, El Segundo, CA (US); Ashita Mirchandani, Torrance, CA (US); Donald He, Redondo Beach, CA (US); Naresh Thapar, Redondo Beach, CA (US); Ritu Sodhi, Rendondo Beach, CA (US); Kyle Spring, Temecula, CA (US); Daniel Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 132 days.

(21) Appl. No.: 10/766,465

(22) Filed: Jan. 27, 2004

(65) Prior Publication Data

US 2004/0251491 A1 Dec. 16, 2004

Related U.S. Application Data

(63) Continuation-in-part of application No. 10/674,444, filed on Sep. 29, 2003, now Pat. No. 6,921,699.

(60) Provisional application No. 60/444,064, filed on Jan. 29, 2003, provisional application No. 60/415,302, filed on Sep. 30, 2002.

(51) Int. Cl.
 *H01L 29/76* (2006.01)
(52) U.S. Cl. ............... 257/288; 257/901; 257/E29.149; 438/294

(58) Field of Classification Search .................. 438/270, 438/271, 272, 589, 259, 292, 293, 294, 295, 438/296, 297, 298; 257/329, 330, 331, 333, 257/341, 342, 355, 412, E29.257, 288, 401, 257/910, 213, 214, E29.148, E29.149, 369, 257/262, 327, 270, 700

See application file for complete search history.

(56) References Cited

U.S. PATENT DOCUMENTS

| | | | | |
|---|---|---|---|---|
| 5,298,442 A | * | 3/1994 | Bulucea et al. | 438/270 |
| 5,814,858 A | * | 9/1998 | Williams | 257/328 |
| 6,001,678 A | | 12/1999 | Takahashi | |
| 6,054,752 A | * | 4/2000 | Hara et al. | 257/629 |
| 6,163,052 A | | 12/2000 | Liu et al. | |

(Continued)

FOREIGN PATENT DOCUMENTS

JP 2000101074 * 4/2000

(Continued)

OTHER PUBLICATIONS

General property of gate oxide and field oxide at http://semiconductorglossary.com/ (search word field oxide & gate oxide).*

(Continued)

*Primary Examiner*—W. David Coleman
*Assistant Examiner*—Su C Kim
(74) *Attorney, Agent, or Firm*—Farjami & Farjami LLP (57) ABSTRACT

A trench power semiconductor device including a recessed termination structure.

7 Claims, 14 Drawing Sheets

U.S. PATENT DOCUMENTS

| | | | |
|---|---|---|---|
| 6,297,101 | B1 | 10/2001 | Schaeffer |
| 6,331,466 | B1 | 12/2001 | Takahashi et al. |
| 6,359,308 | B1 | 3/2002 | Hijzen et al. |
| 6,388,286 | B1 | 5/2002 | Baliga |
| 6,455,378 | B1 | 9/2002 | Inagawa et al. |
| 7,045,859 | B2 * | 5/2006 | Amali et al. ............... 257/333 |
| 2001/0026989 | A1 * | 10/2001 | Thapar ...................... 438/400 |
| 2002/0019099 | A1 * | 2/2002 | Williams et al. ............ 438/270 |
| 2002/0167046 | A1 * | 11/2002 | Aoki et al. ................. 257/330 |
| 2003/0205758 | A1 * | 11/2003 | Zeng ......................... 257/341 |

FOREIGN PATENT DOCUMENTS

| | | |
|---|---|---|
| JP | 2000101074 A | 4/2000 |
| JP | 2001127072 | 5/2001 |
| JP | 2002299618 A | 10/2002 |
| WO | WO 01/01484 A2 | 1/2001 |

OTHER PUBLICATIONS

Japanese Office Action for Japanese Application No. 2005-518373 mailed Jan. 8, 2008 (with English translation).

* cited by examiner

Figure 4  R*Qg as a function of trench depth

Figure 5a  In-circuit efficiency comparison for the Control FET at 200kHz

Figure 5b  In-circuit efficiency comparison for the Control FET at 1MHz

Figure 6a In-circuit efficiency comparison for the Sync FET at 200kHz

Figure 6b In-circuit efficiency comparison for the Sync FET at 750kHz

TRENCH MOSFET TECHNOLOGY FOR DC-DC CONVERTER APPLICATIONS

RELATED APPLICATION

This application is a continuation-in-part of U.S. patent application Ser. No. 10/674,444, filed Sep. 29, 2003, now U.S. Pat. No. 6,921,699 entitled SEMICONDUCTOR DEVICE PROCESSING which claims priority to U.S. Provisional Application No. 60/415,302, filed Sep. 30, 2002, and U.S. Provisional Application No. 60/444,064 filed Jan. 29, 2003. This application is also based on and claims benefit of U.S. Provisional Application No. 60/444,064, filed Jan. 29, 2003, entitled TRENCH MOSFET TECHNOLOGY FOR DC-DC CONVERTER APPLICATIONS, to which a claim of priority is hereby made.

BACKGROUND OF THE INVENTION

DC-DC converters are typically used in battery operated devices such as portable computers, portable telephones, and personal digital assistants to regulate the amount of power supplied from the battery to the device. The life of the battery in a portable device depends on the efficiency of its power circuitry. The ever-increasing demands for greater power supply and longer lasting battery power have, therefore, made efficiency in DC-DC converters an important factor for designers.

The efficiency of a DC-DC converter can be improved if certain characteristics of the semiconductor switching devices of the converter are improved. Specifically, when power MOSFETs are used in a converter lowering of the on-resistance, the gate charge and increasing the current capability of the MOSFETs will contribute significantly to the efficiency.

One way to improve the key characteristics of a power MOSFET, for example, the ON resistance of a MOSFET, is to increase the density of the cells of its active area. The increase in the cell density in a power MOSFET, however, may be restricted by the condition of the material used to form the device and the inherent limitations of the process used.

Photolithography is one specific area of processing which imposes restrictions on the reduction of device features. One material condition that imposes limitations on the reduction of the features in a MOSFET is the surface planarity of the die in which the device is formed. Generally, when the features of a semiconductor device are made smaller and thus the density of the features is increased, the surface of the die (or the wafer in which the die is part of during processing) must be made as flat as possible in order to allow for the proper imaging of the features of the device during photolithography. As the density of features is increased the surface planarity of the die becomes a critical factor.

It is thus desirable to overcome the limitations of the prior art in order to obtain a device with a higher density of active cells.

SUMMARY OF THE INVENTION

The present invention relates to a trench-type power semiconductor device with a recessed termination structure formed around the active area of the device and below the major surface of the active area of the device. The recessed termination structure can significantly reduce the electrical field crowding at termination, thus eliminating the need for P+ guard rings without compromising the device breakdown voltage and ruggedness.

A recessed termination structure according to the present invention includes a field oxide layer and a field plate over the field oxide layer, both formed in a trench that is disposed around the active region of the device. The field oxide in the termination structure according to the present invention is grown using the LOCOS process after the termination trench has been formed in a semiconductor die. Typical avalanche energy for a termination structure according to the invention was measured to be over 1J for a die of maximum size in DPAK.

According to an aspect of the present invention the field oxide is disposed beneath the surface of the active area of the device. When field oxide sits on top of a silicon surface, there will be a photoresist thickening effect at the edge of the field oxide. This thickening effect makes it difficult to resolve sub-micron features during photolithography. It is believed that by disposing the field oxide beneath the top surface of the active region, it is possible to enhance resolution and improve the manufacturability of sub-micron features significantly. Thus, by employing a recessed termination structure according to the present invention the trenches can be reduced in size thereby increasing the cell density of the device. For example, by employing the method of the present invention thinner photoresist can be employed to reduce the trench width to below 0.5 microns. Using the method of the present invention a trench width of 0.4 microns was achieved, which is a 20% improvement over the prior art. It is believe that even smaller features can be obtain by applying the principles of the present invention.

In addition, the process for manufacturing the device according to the present invention allows for trenches with a reduced depth. As a result, characteristics such as ON resistance and the current carrying capability are improved.

Furthermore, because of the reduction in the feature size, a device according to the invention includes a higher channel density, but, surprisingly, keeps gate charges low, especially the $Q_{GD}$ and $Q_{SWITCH}$. While the feature sizes such as trench width and depth are being reduced, the gate oxide integrity remains high. The inventors have discovered that the dielectric integrity can be over 7 MV/cm.

Additionally, in a process for manufacturing a preferred embodiment of the present invention, a contact process was employed to optimize the channel length to reduce the device on-resistance. The novel process sequence made it possible to have 100% metal step-coverage in spite of the sub-micron feature size. It also enabled the use of a thinner epitaxial layer to further reduce on-resistance.

Another benefit of a thinner epitaxial layer is the reduction of Qrr, which is critical at high frequencies. In a device according to the invention, further optimization can result in about 50% reduction in substrate resistance.

DETAILED DESCRIPTION OF EMBODIMENTS OF THE INVENTION

Figure 1:
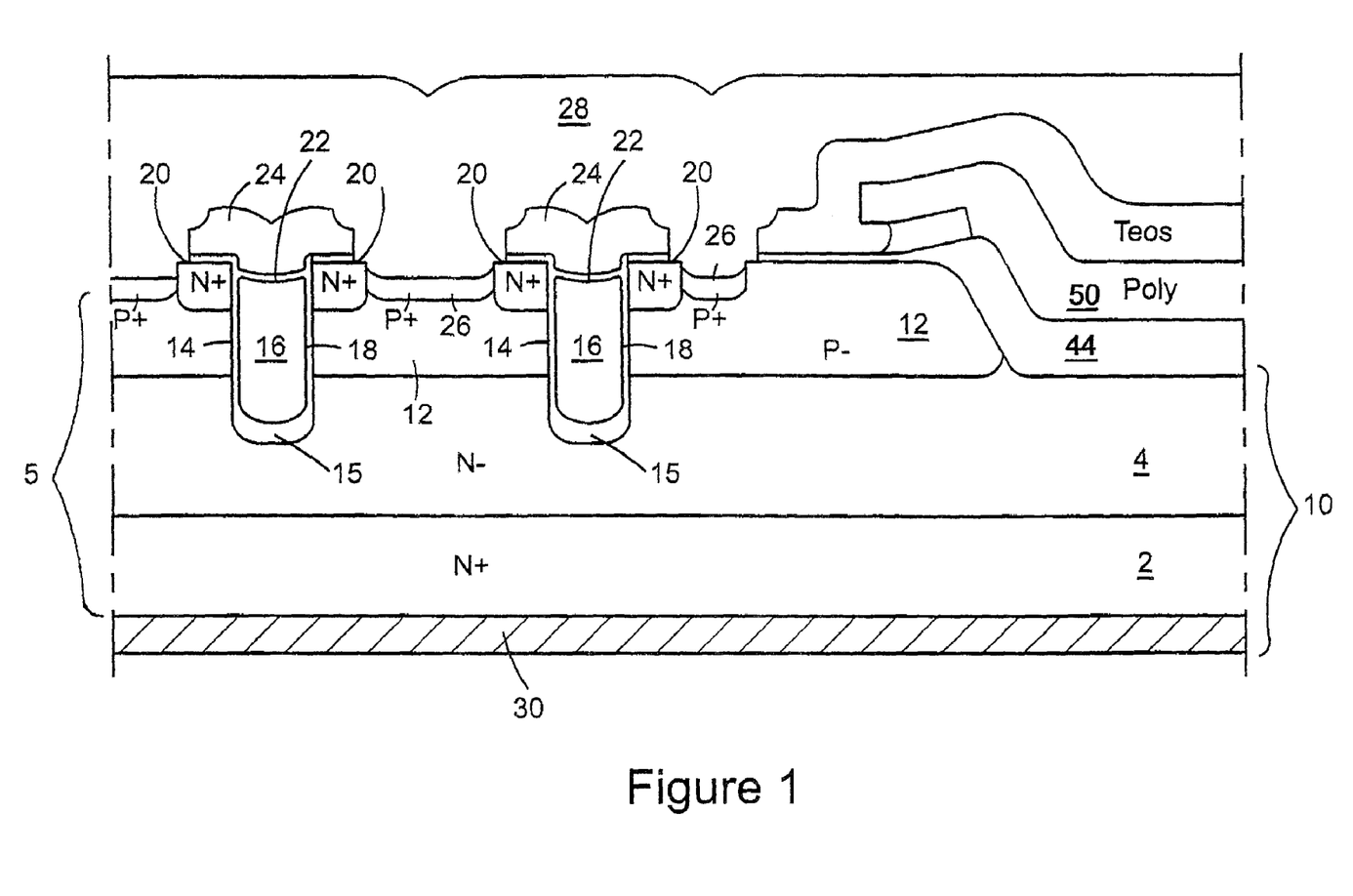
FIG. 1 shows the cross-sectional view of a portion of a semiconductor device according to the present invention.

Referring to FIG. 1, a semiconductor device according to the present invention is formed in silicon die 5 which includes drain region 10 of a first conductivity type, and channel region 12, which is lightly doped with dopants of a conductivity type that is opposite to those of drain region 10. A semiconductor device according to the present invention includes a plurality of trenches 14 extending from the top surface of die 5 to drain region 10. Trenches 14 have disposed therein conductive material such as doped polysilicon to form gate electrode 16. Gate electrodes 16 are electrically insulated from channel region 12 by oxide 18. Oxide 18 is formed at the side walls of each trench 14. It should be noted that a thick oxide 15 is formed at the bottom of each trench.

A semiconductor device according to the present invention also includes self-aligned source regions 20 which are disposed on opposite sides of each trench 14 and extend to a predetermined depth less than the thickness of channel region 12. Self-aligned source regions 20 are doped with dopants of the same conductivity as drain region 10.

Each gate electrode 16 has disposed on the top surface thereof gate isolation layer 22. Disposed on the top surface of each gate isolation 22 is a layer of low temperature insulation material 24. Adjacent each source region 20, extending from the top surface of channel region 12, preferably to a depth that is less than the depth of an adjacent source region 20, is a highly doped contact region 26 which is doped with dopants of the same conductivity as those in channel region 12. Highly doped contact regions 26 are formed on the bottom of depressions on the top surface of die 5. Source contact layer 28, which is typically composed of an aluminum alloy, is disposed over the top surface of die 5 in ohmic contact with source regions 20 and contact regions 26 thereby shorting source regions 20 and contact regions 26. Drain contact layer 30, which may be composed of trimetal or some other suitable solderable contact metal, is disposed on the free surface of die 5 opposite to source contact layer 28 and in ohmic contact with drain region 10.

A semiconductor according to the present invention includes termination region 40. Termination region 40 includes a recessed termination structure. The recessed termination structure includes a layer of field oxide 44 formed at a depth below the surface of the active region (the region containing active cells), and field plate 50. The termination structure is disposed around the active region of the device.

FIG. 1 only shows a portion of a semiconductor device produced according to the present invention. One skilled in the art would understand that in an actual semiconductor device the active region would include a greater number of trenches 14.

The semiconductor device shown by FIG. 1 is of the trench variety. A trench type device is operated by applying voltage to its gate electrodes 16 in order to invert the regions immediately adjacent oxide 18, thus electrically connecting its' source regions 20 to its drain region 10. The semiconductor device shown by FIG. 1 is an N-channel device. By reversing the polarities of the dopants in each region, a P-channel device may be obtained.

Die 5 in the preferred embodiment is comprised of a monolithic silicon substrate 2 which has an epitaxial layer formed over its top surface. Trenches 14 as described above are formed in epitaxial layer. Drain region 10 as described herein refers to drift region 4 which is disposed between substrate 2 and channel region 12. A skilled person in the art would recognize that semiconductor die of other material or structure may be used without deviating from the present invention.

A semiconductor device such as the one shown by FIG. 1 is manufactured according to the following process.

Figure 2A:
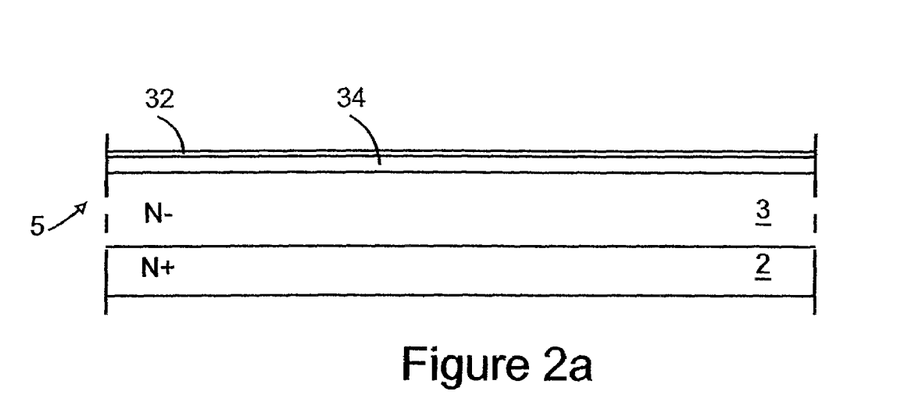
FIGS. 2a-2u illustrate a process for manufacturing a device according to the present invention.

Referring first to FIG. 2a, initially a layer of pad oxide 32 is formed atop epitaxial layer 3 of silicon die 5, which is doped with dopants of a first conductivity type. In the example shown, the dopants of the first conductivity type are N-type dopants. Dopants of a conductivity type opposite to those of the first conductivity type (P-type) are then implanted through pad oxide 32 to form shallow channel implant region 34 that is to become channel region 12 (FIG. 1) as will be described later.

Figure 2B:
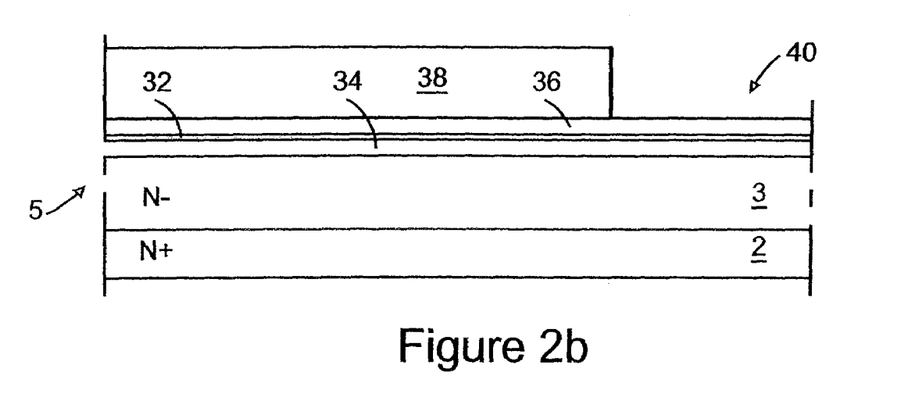
Figure 2C:
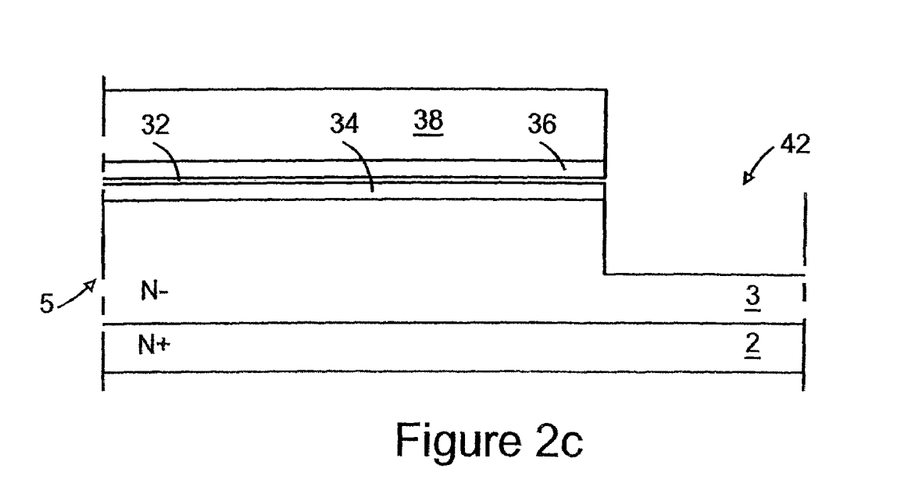
Figure 2D:
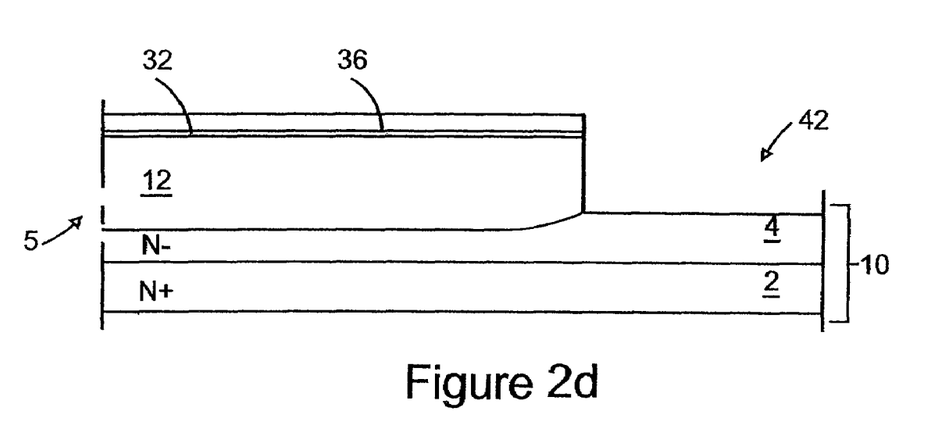

Referring next to FIG. 2b, nitride layer 36 is deposited atop pad oxide 32. An active mask comprising a layer of photoresist 38 is deposited over a substantial portion of nitride layer 36 leaving only termination region 40 exposed. Next, as shown in FIG. 2c, using photoresist 38 as a mask, termination recess 42 is formed by, for example, conventionally known dry etching techniques or some other suitable etching method. Photoresist 38 is then removed and the dopants in shallow channel implant region 34 are driven in a diffusion drive to form channel region 12 as shown in FIG. 2d. It should be noted that, although not shown, termination recess 42 is disposed around the active region of the device.

Figure 2E:
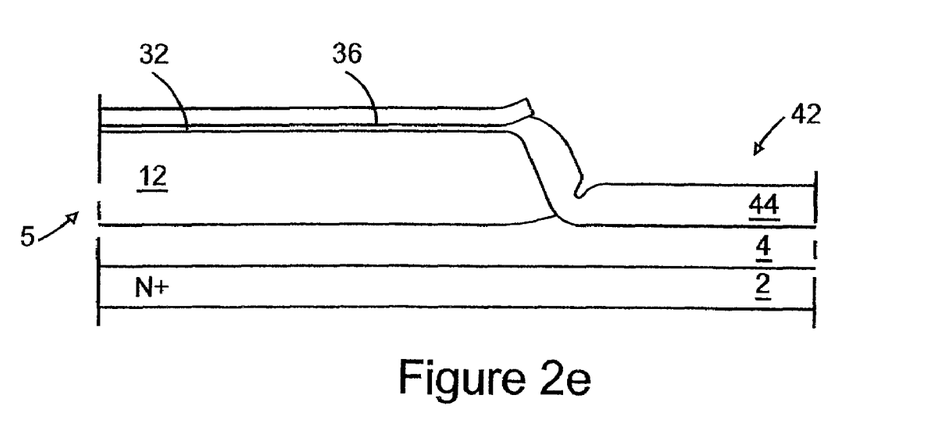

Referring next to FIG. 2e, field oxide 44 is formed in termination recess 42 thereby providing a recessed field oxide termination structure.

Figure 2F:
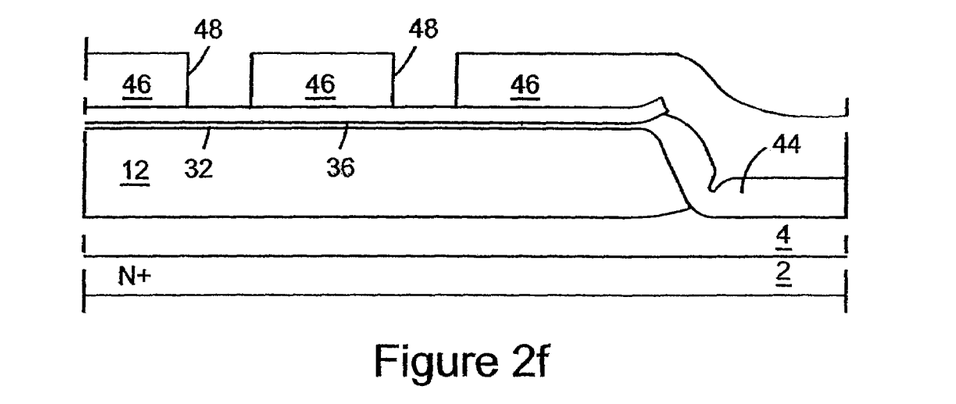
Figure 2G:
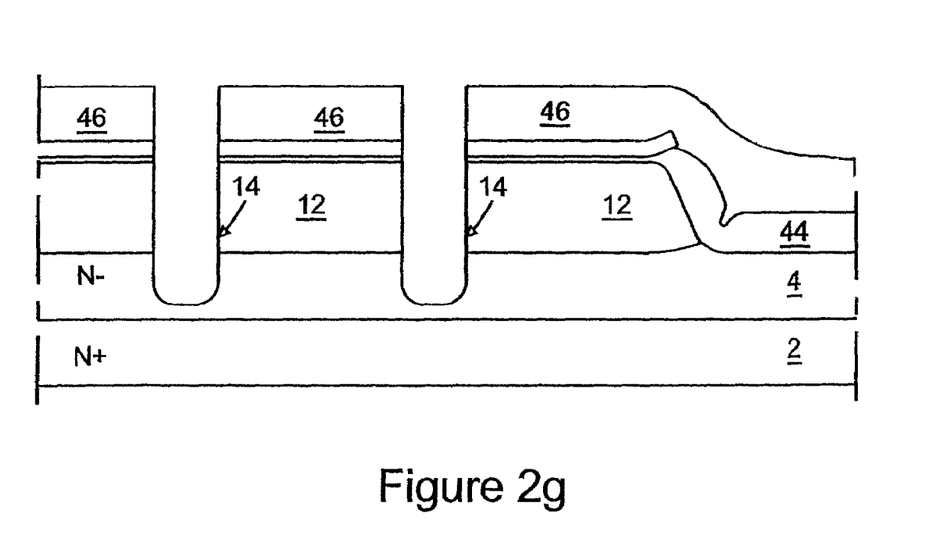

Referring next to FIG. 2f, trench mask 46 is deposited over the top surface of nitride 36 and field oxide 44. Trench mask 46 includes openings 48 to identify the positions of trenches 14 (FIG. 1) that are to be formed in die 5. Next, trenches 14 are formed in the body of die 5 in the positions identified by openings 48 as shown in FIG. 2g. Trenches 14 are formed by dry etching and extend from the top surface of die 5, through channel region 12 to a predetermined depth in drift region 4. It should be noted that it is also possible to extend trenches 14 below drift region 4. It should also be noted that the trenches 14 may be in the form of parallel stripes, hexagonal or some other form, although stripes are preferred in that stripes may further reduce gate charge.

Figure 2H:
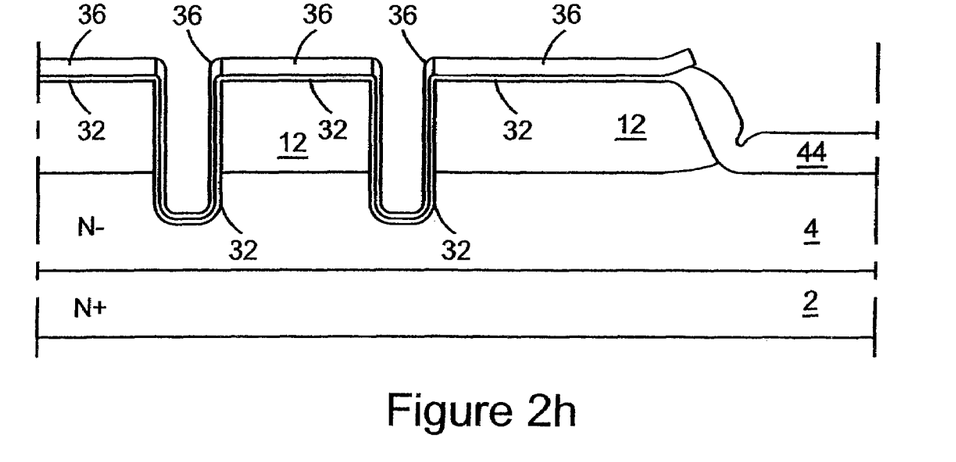

After the formation of trenches 14, a layer of sacrificial oxide is grown on the sidewalls and bottom of trenches 14 and then etched. Thereafter, trench mask 46 is removed. Next, pad oxide 32 is formed into trenches 14 as shown in FIG. 2h. Referring again to FIG. 2h, nitride layer 36 is extended over pad oxide 32 inside trenches 14 by deposition of a nitride layer.

Figure 2I:
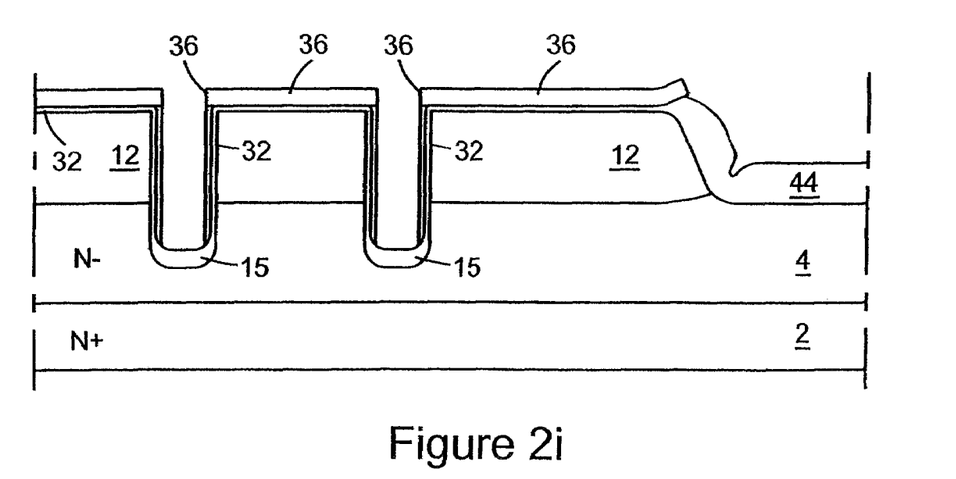

Referring to FIG. 2i, the portion of nitride 36 that is disposed at the bottom of each trench 14 is then removed by, for example, dry etching and thick oxide 15 is grown at the bottom of each trench 14. Nitride 36 disposed on the sidewalls of each trench 14 is an oxidation retardant which prevents the growth of oxide on the sidewalls of trenches 14 while allowing the growth of a thick oxide layer at the bottom of each trench. As a result, the sidewalls of each trench 14 may be covered with a very thin oxide layer, while its bottom will be fully insulated because of thick oxide 15.

Figure 2J:
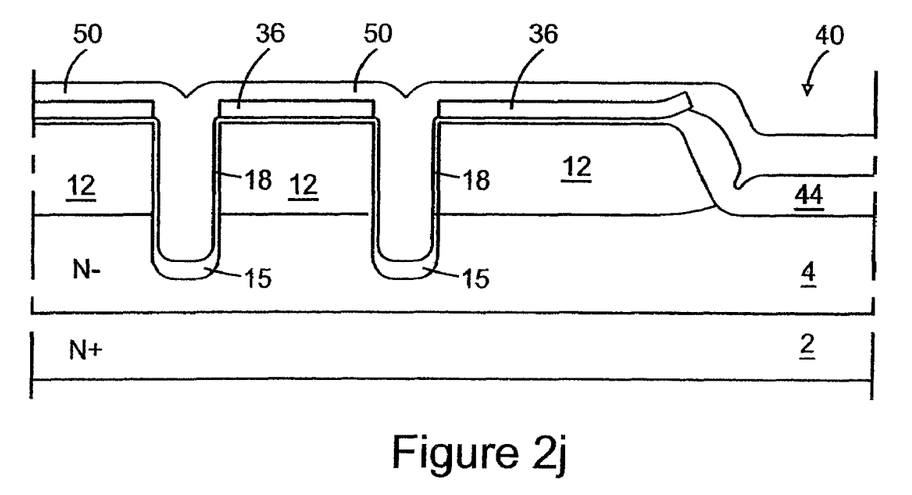

Next, as shown in FIG. 2j, portions of nitride 36 that cover sidewalls of trenches 14 are removed through, for example, wet etching and, gate oxide layer 18 is grown inside each trench 14. Then, a layer of polysilicon 50 is deposited such that trenches 14 are filled with polysilicon.

Figure 2K:
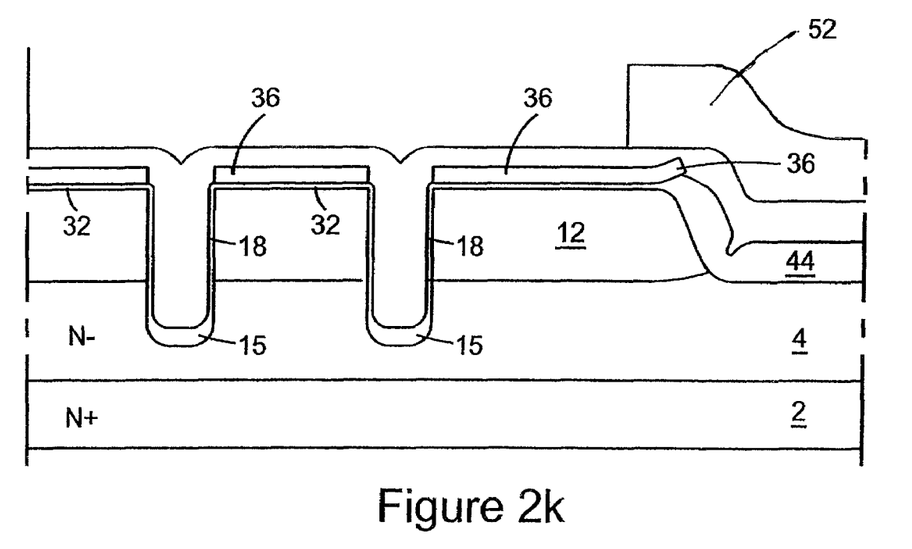
Figure 2L:
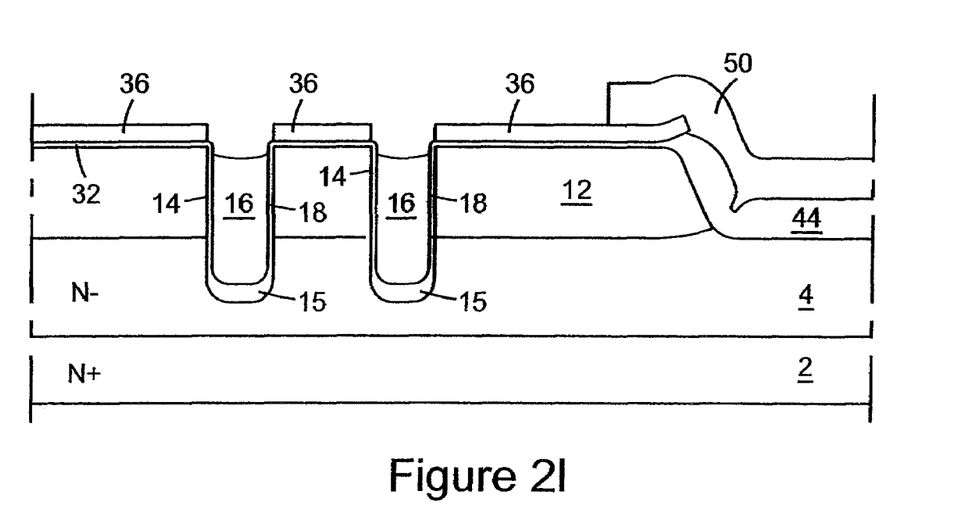

Referring next to FIG. 2k, polysilicon mask 52 is formed to cover at least termination region 40. Next, to form gate electrodes 16, polysilicon layer 50 is etched such that inside each trench 14 there will be a polysilicon body that extends between its bottom to a position above channel region 12. As a result, a layer of polysilicon will be left under polysilicon mask 52, which will then constitute field plate 50 as shown in FIG. 2l.

Figure 2M:
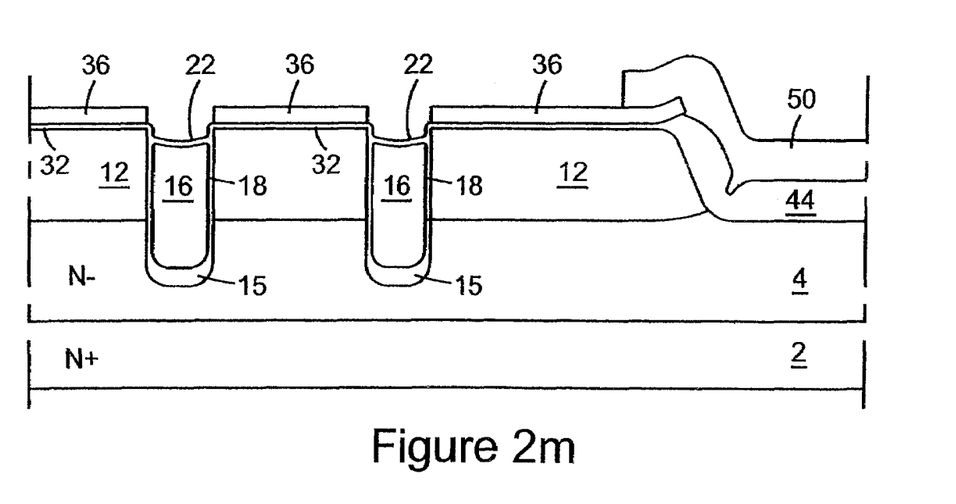
Figure 2N:
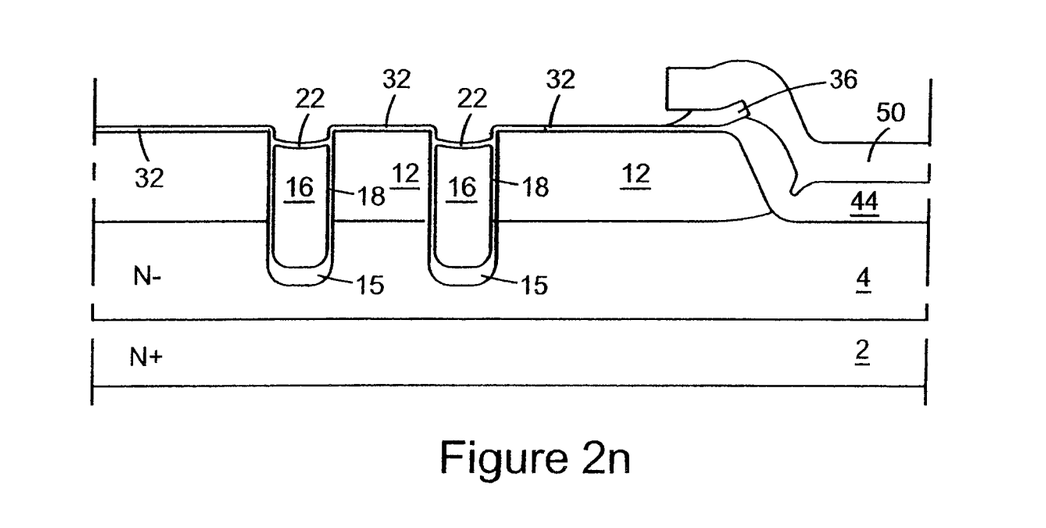

Referring next to FIG. 2m, the top surface of gate electrode 16 in each trench 14 is oxidized by, for example, thermal oxidation to form isolation layer 22. Then, substantially all of nitride 36 is removed by, for example, wet etching to leave behind only small portions of nitride 36 near the termination structure of the semiconductor device as shown by FIG. 2n.

Figure 2O:
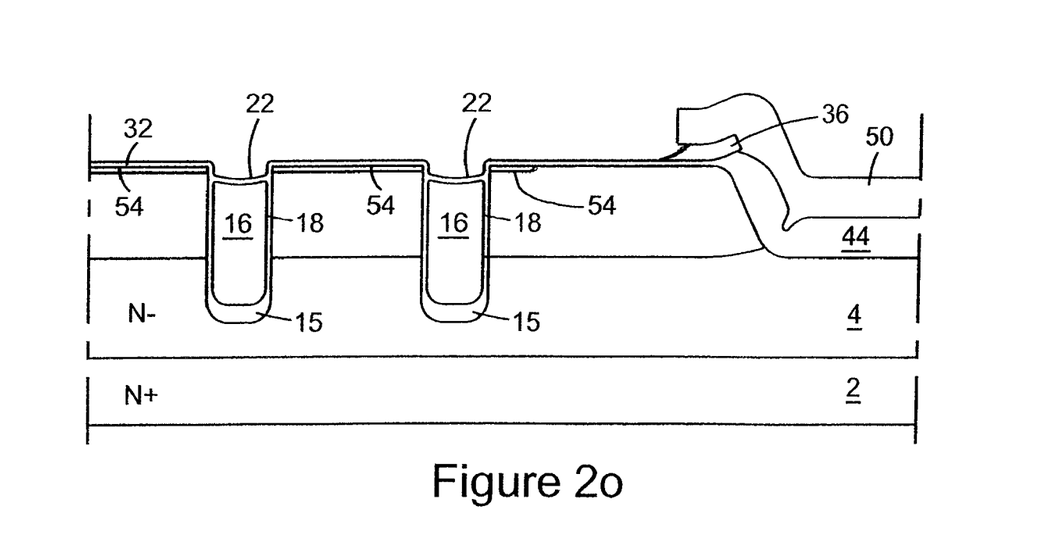
Figure 2P:
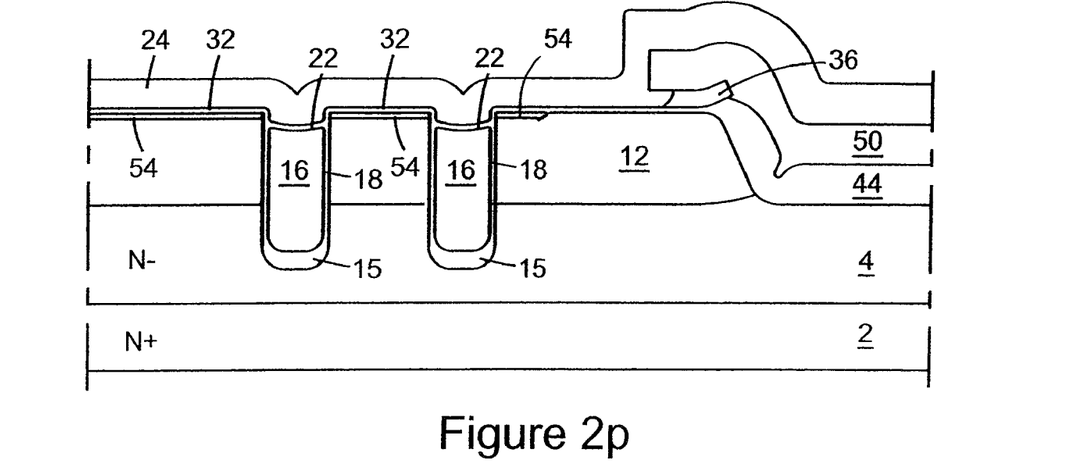

Following the substantial removal of nitride layer 36, dopants for formation of source regions 20 are implanted through a source mask to form source implant region 54 as shown in FIG. 2o. Preferably, source implant region 54 does not extend as far as the termination structure of the device. The formation of source implant region 54 is then followed by the deposition of a layer of low temperature oxide 24 over the entire top surface of die 5 as shown in FIG. 2p. It should be noted that source implant region 54 is formed after the thermal oxidation of polysilicon to form isolation layer 22. By implanting source dopants after the thermal oxidation process, the final depth of source regions 20 can be kept to a minimum. As a result, the depth of channel region 12, and also thickness of epitaxial layer 3 can be minimized, thereby reducing the ON-resistance of the device by both shortening the channels, and reducing the thickness of the drift region 4 in the device.

Figure 2Q:
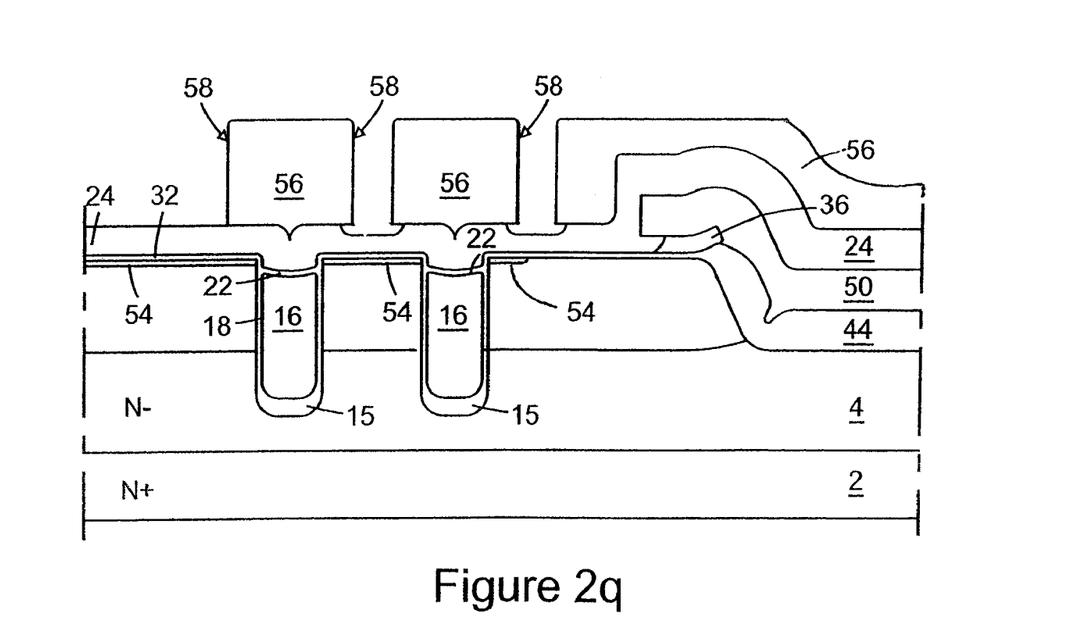
Figure 2R:
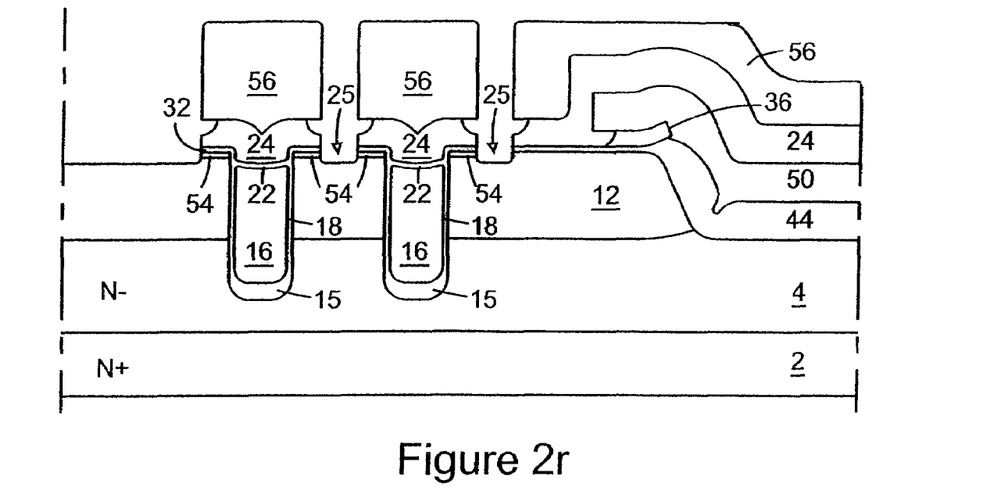

Next, source contact mask 56 is formed over low temperature oxide 24 as shown in FIG. 2q. Source contact mask 56 is formed by patterning a photoresist layer in a known manner to include openings 58. Openings 58 are first used to taper etch portions of low temperature oxide layer 24 such that the etched area extends laterally under source contact mask 56 and vertically to a depth that is less than the thickness of low temperature oxide 24. Then, using openings 58 in source contact mask 56 etching is continued vertically to create depressions 25 that extend to a depth below source implant region 54 as shown in FIG. 2r. The initial taper etching improves step coverage once the source contact is formed.

Figure 2S:
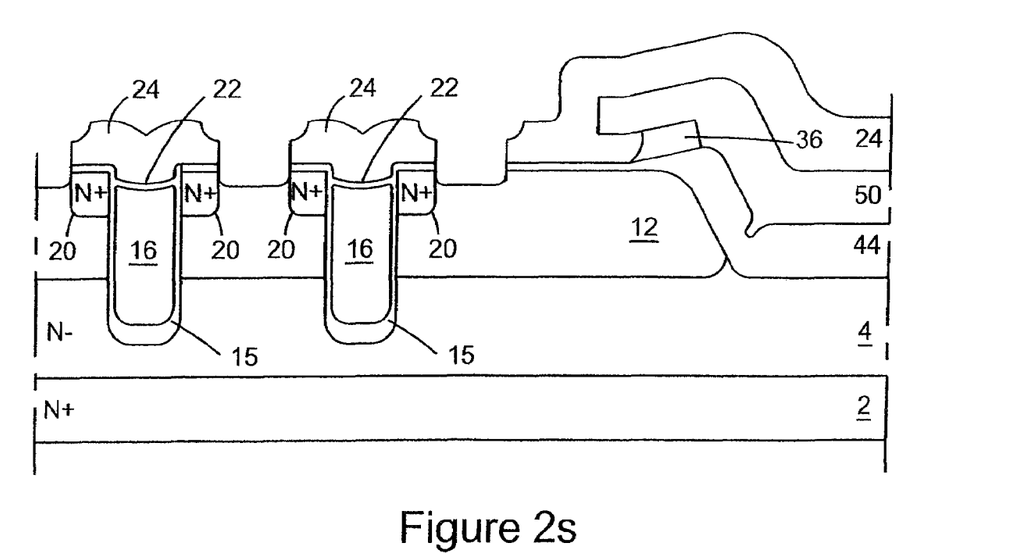
Figure 2T:
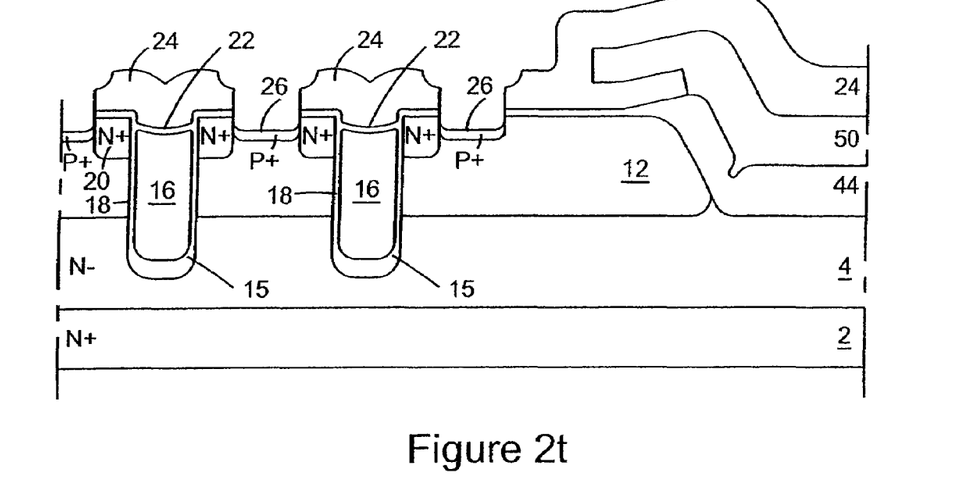

Next, source contact mask 56 is removed and the dopants in the source implant region 54 are subjected to a diffusion drive to form source regions 20 as shown by FIG. 2s. After the source diffusion drive, highly doped contact regions 26, as shown in FIG. 2t, are formed between source regions 20 through an implant step using low temperature oxide 24 as a mask followed by a diffusion drive. Low temperature oxide 24 may be then etched back to expose portions of source regions 20 at the top surface of die 5.

Figure 2U:
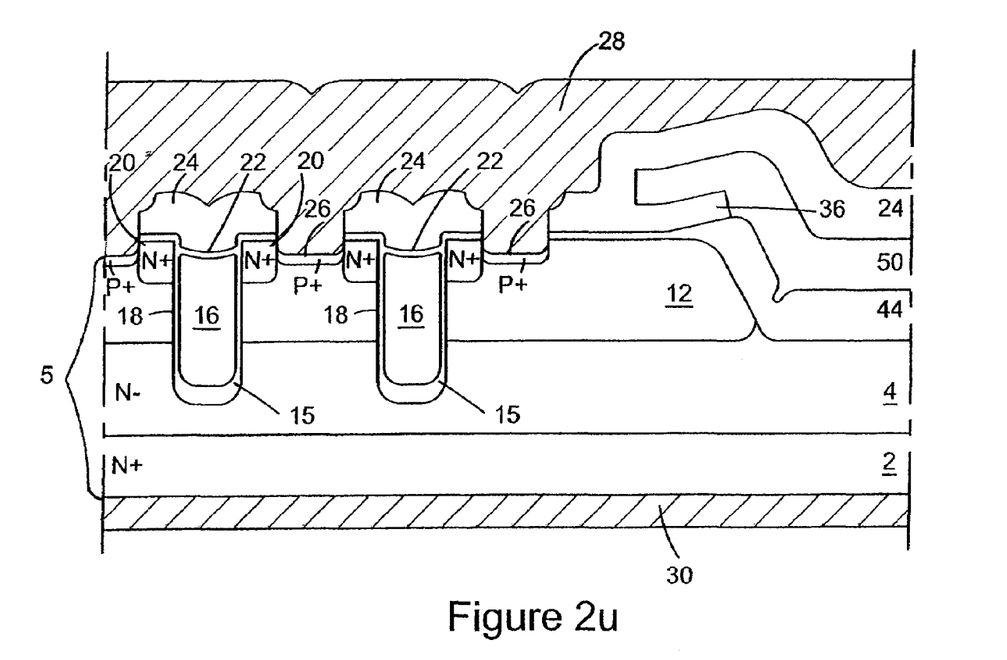

Next, source contact 28 is deposited over the top surface of die 5 and drain contact 30 is formed on the bottom surface of die 5 as shown by FIG. 2u. In addition to the foregoing steps, conventionally known steps may be carried out before or after the formation of source contact 28 to form a gate contact structure (not shown) on the top surface of die 5.

Figure 3:
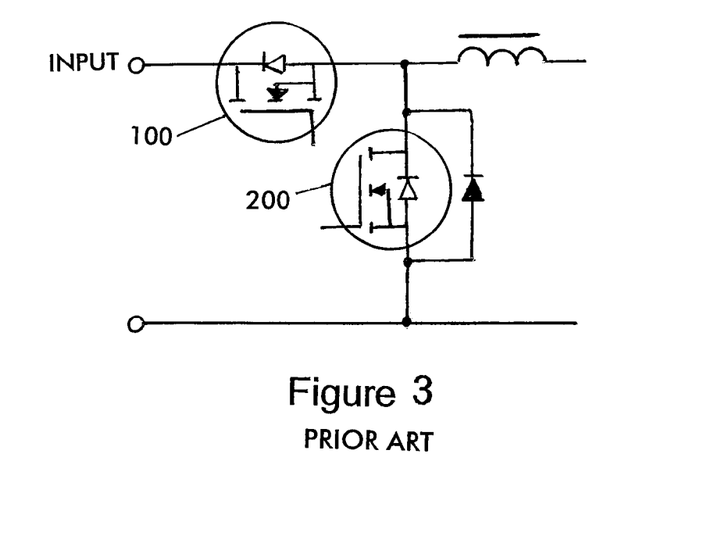
FIG. 3 shows a typical converter circuit according to prior art.

Devices according to the present invention were tested for their efficiency in a converter circuit. Referring to FIG. 3, a typical converter circuit includes Control FET 100 and Sync FET 200.

To determine the efficiency of devices according to the present invention several 30V N-channel devices were manufactured and tested in a converter circuit in the Sync FET 200 position and the Control FET 100 position. The cell pitch of each device was optimized for the Control FET 100 and the Sync FET 200 to achieve the best in-circuit performance. The figures of merit of each device studied is provided in Table 1.

TABLE 1

| Parameter | Unit | Control FET | Sync FET |
|---|---|---|---|
| $R_{Si}*AA$ @ $10\,V_{GS}$ | mOhm*mm$^2$ | 16 | 12 |
| $R_{Si}*AA$ @ $4.5\,V_{GS}$ | mOhm*mm$^2$ | 22 | 17 |
| $R_{Si}*Q_G$ @ $4.5\,V_{GS}$ | mOhm*nC | 75 | 77 |
| $Q_G/AA$ @ $4.5\,V_{GS}$ | nC/mm$^2$ | 3.4 | 4.7 |
| $Q_{GD}/AA$ @ $4.5\,V_{GS}$ | nC/mm$^2$ | 0.9 | 1.4 |
| $Q_{Switch}/AA$ @ $4.5\,V_{GS}$ | nC/mm$^2$ | 1.3 | 1.8 |

It is conventional knowledge that at a given base depth, the deeper the trench depth, the lower the on-resistance. A deeper trench, however, results in a higher gate charge, which is undesirable.

Figure 4:
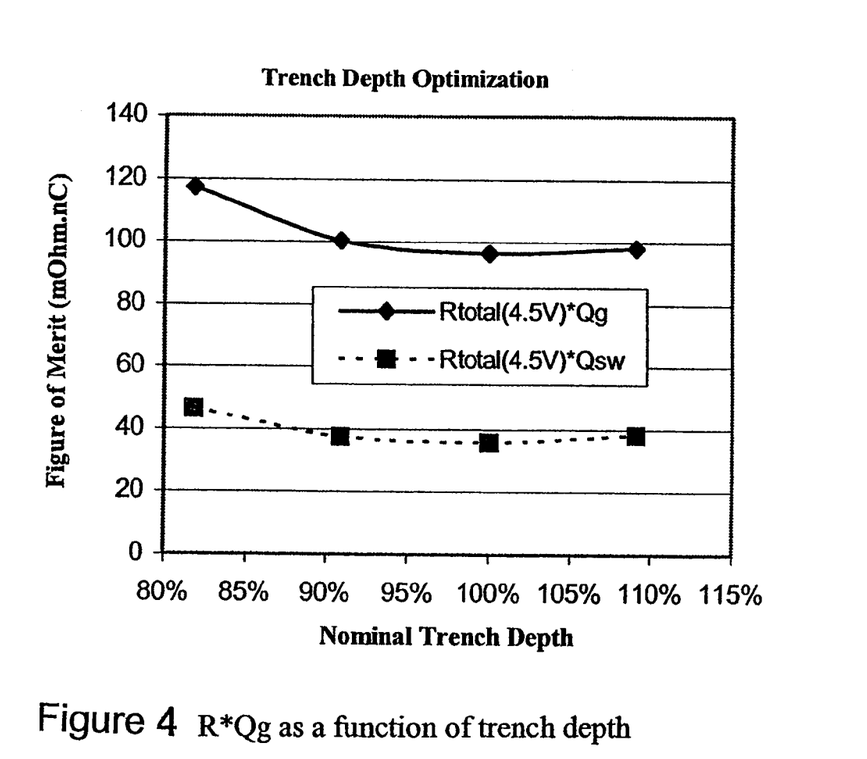
FIG. 4 graphically illustrates the figure of merit for devices according to the present invention as a function of trench depth.
Figure 5A:
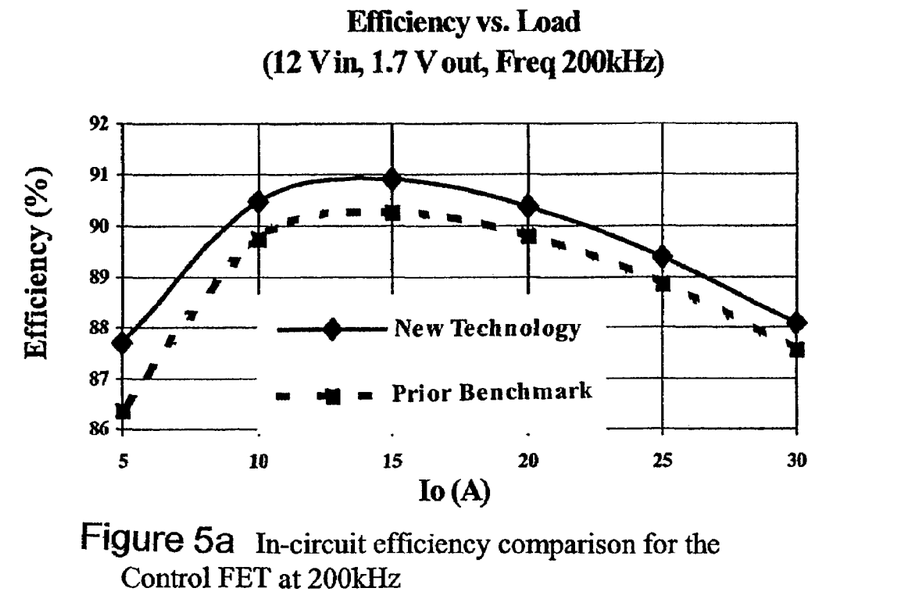
FIGS. 5a-5b, and 6a-6b show graphical comparisons of in-circuit efficiency of devices according to the present invention with the efficiency of prior art devices.
Figure 5B:
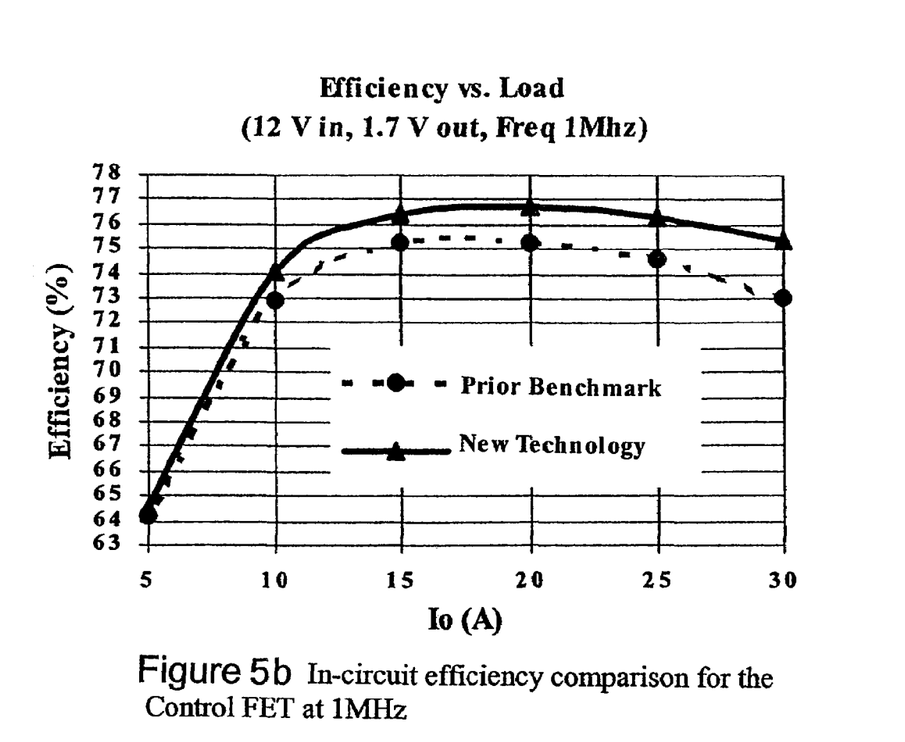

Referring to FIG. 4, experimental data surprisingly showed that in a device according to the present invention an optimal combination of on-resistance and gate charge can be obtained if the trench depth is decreased. Specifically, FIG. 4 shows R*Qg and R*Qsw have a minimum at 100% nominal trench depth.

To obtain the lowest possible on-resistance for a given die size in Sync-FET 200 position, a narrow cell pitch was used. The narrow cell pitch was combined with shallower trench depth, low resistivity substrate, and optimized epitaxial layer, to obtain a low $R_{Si}*AA$ of 12 mOhm.mm$^2$ surprisingly without significantly increasing the gate charge.

In the Control FET 100 position, switching loss is the dominant component of the total power loss. As the switching frequency increases, the requirements on the Control FET become more stringent. In designing a Control FET 100, making the right trade-off between the Rdson and gate charge is very critical. An advantage of a device according to the present invention is that it enables the improvement in both R*AA and Qg/AA. Thus, a Control FET 100 can be made with low gate charge and low on-resistance. The optimized Control FET 100 design resulted in a low R*Qg of 75 mohm.nC.

In addition, with the proper epitaxial optimization, the Qrr for a device according to the present invention was reduced from 13.4 nC/mm$^2$ to 5.1 nC/mm$^2$. As a result the switching frequency was increased to higher than 1 MHz.

Figure 6A:
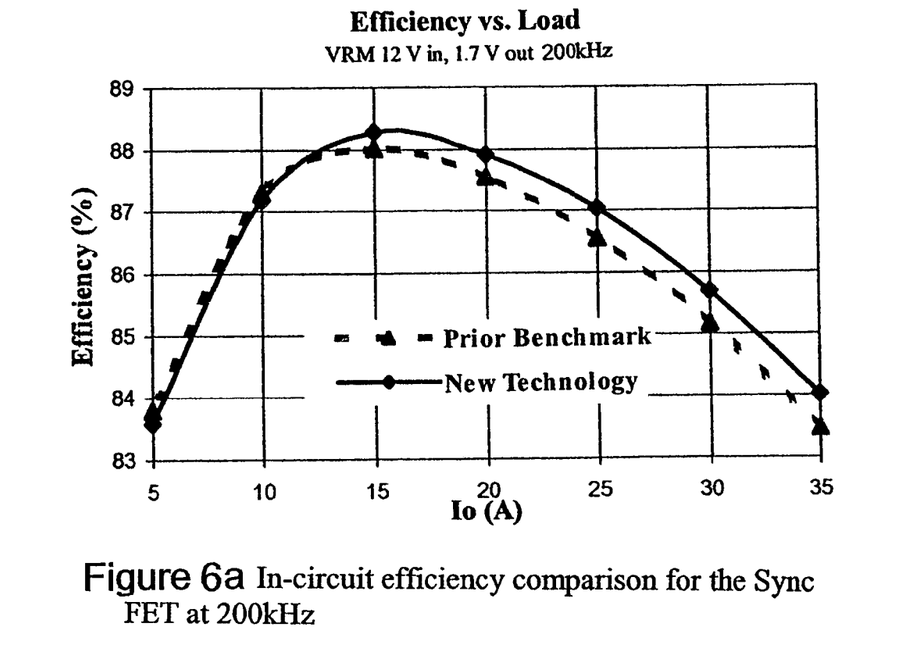
Figure 6B:
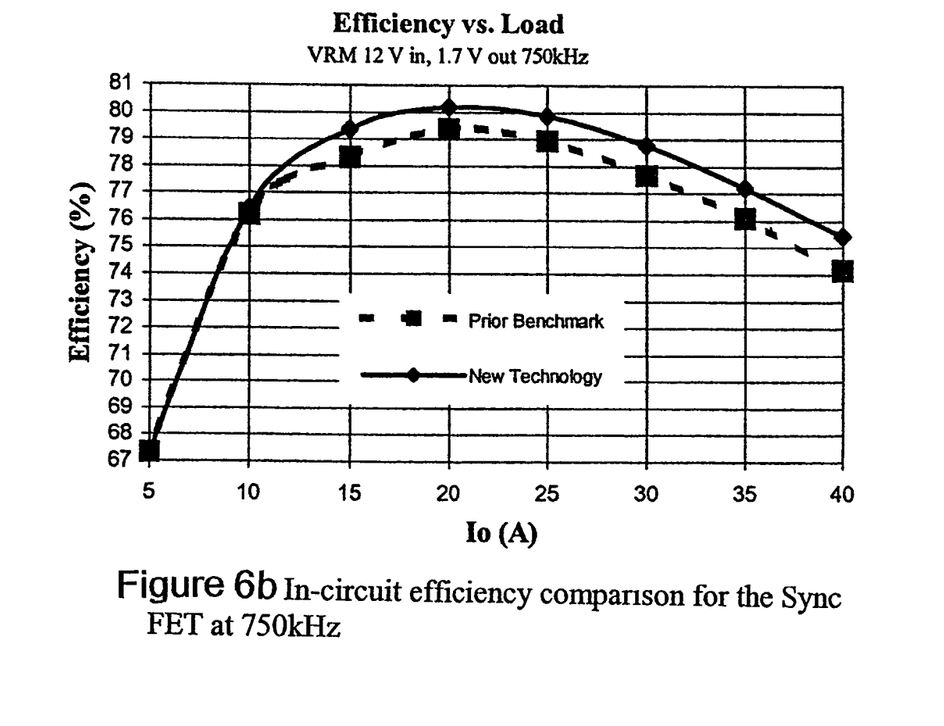

FIGS. 5a-5b and 6a-6b show the in-circuit efficiency results for devices according to the present invention as compared to the prior art devices at different switching frequencies. As see in FIGS. 5a and 5b, a Control FET 100 according to the present invention offers up to 1% higher efficiency at 200 kHz and up to 2% higher efficiency at 1 MHz. FIGS. 6a and 6b show that a Sync FET 200 according to the present invention offers 0.5% to 1.5% better efficiency at 200 kHz and 750 kHz respectively.

To summarize, a device according to the present invention exhibits superior performance. For example, the figure of merit R*AA has reached as low as 12 mOhm.mm$^2$ for a 30V N-channel FET when optimized for a SyncFET 200. When disposed in a low resistance package, such as a package sold by the assignee under the mark DirectFET, a device according to the present invention can deliver a peak current of 113 Amperes with a footprint that is no more than that of a standard S0-8 package. Yet when optimized for a Control FET 100, R*Qg is only 75 mOhm.nC for a 30V N-channel FET, which is only half of what is currently known as the best in the prior art. In a device according to the present invention the reverse recovery charge Qrr/AA can be reduced from 13.4 nC/mm$^2$ to 5.1 nC/mm$^2$ if the epitaxial thickness is optimized. The reduced reverse recovery charge is generally critical for high switch frequency (>=1 MHz). These improved characteristics directly translate into much improved in-circuit efficiency at various switching frequencies.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A DC-DC converter comprising:
   a synchronous semiconductor device; and
   a control semiconductor device;
   wherein at least one of said semiconductor devices includes:
   a semiconductor body of a first conductivity type which includes a channel region of a second conductivity type and a major surface;
   an active region formed in said semiconductor body, said active region including a plurality of spaced trenches each less than 0.5 microns wide and each extending through said channel region;
   a gate structure disposed in each said trench, each gate structure including a gate oxide layer disposed at least on sidewalls of a trench and a gate electrode disposed adjacent said gate oxide layer;
   conductive regions of said first conductivity type formed in said channel region adjacent each said trench;
   highly doped contact regions of said second conductivity type formed in said channel region each being laterally confined between two opposing conductive regions;
   a metallic contact in contact with said conductive regions and said highly doped contact regions; and
   a termination structure, said termination structure including,
   a termination trench formed in said semiconductor body, said termination trench including a slanted sidewall adjacent said channel region and a bottom adjacent said semiconductor body; a grown field oxide layer formed in said termination trench below said major surface; a polysilicon field plate formed over said field oxide layer; and an oxide body over said polysilicon field plate, wherein said field oxide layer is thicker than said gate oxide layer, wherein said metallic contact extends over said oxide body, and wherein said semiconductor body of said first conductivity type extends from said active region to the bottom of said termination trench, whereby said bottom of said termination trench is adjacent a region of said first conductivity type, wherein said trenches extend deeper into said semiconductor body than said termination trench.

2. A DC-DC converter according to claim 1, wherein each said trench includes an oxide mass formed at its bottom, said oxide mass being thicker than said gate oxide layer.

3. A DC-DC converter according to claim 2, further comprising a semiconductor substrate of said first conductivity, said semiconductor body being formed over said semiconductor substrate, wherein said conductive regions are electrically connectable to said semiconductor substrate through invertible channels adjacent said trenches.

4. A DC-DC converter according to claim 3, wherein said conductive regions are source regions.

5. A DC-DC converter according to claim 1, wherein each said trench is a stripe.

6. A DC-DC converter according to claim 1, wherein each said trench is a cell.

7. A DC-DC converter according to claim 6, wherein each said cell is hexagonal.

* * * * *